US009585257B2

(12) United States Patent
Gambino et al.

(10) Patent No.: US 9,585,257 B2
(45) Date of Patent: Feb. 28, 2017

(54) METHOD OF FORMING A GLASS INTERPOSER WITH THERMAL VIAS

(71) Applicant: GLOBALFOUNDRIES INC., Grand Cayman (KY)

(72) Inventors: Jeffrey P. Gambino, Portland, OR (US); Richard S. Graf, Gray, ME (US); Sudeep Mandal, Bangalore (IN); David J. Russell, Owego, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 14/668,031

(22) Filed: Mar. 25, 2015

(65) Prior Publication Data
US 2016/0286660 A1  Sep. 29, 2016

(51) Int. Cl.
| | |
|---|---|
| H05K 3/02 | (2006.01) |
| H05K 3/00 | (2006.01) |
| H01L 21/48 | (2006.01) |
| H01L 21/768 | (2006.01) |
| H01L 23/373 | (2006.01) |
| H05K 1/02 | (2006.01) |
| H05K 1/11 | (2006.01) |
| H05K 3/40 | (2006.01) |
| H01L 21/60 | (2006.01) |

(52) U.S. Cl.
CPC ......... *H05K 3/0094* (2013.01); *H01L 21/486* (2013.01); *H01L 21/76877* (2013.01); *H01L 23/3731* (2013.01); *H01L 23/3732* (2013.01); *H01L 23/3738* (2013.01); *H05K 1/0201* (2013.01); *H05K 1/115* (2013.01); *H05K 3/4038* (2013.01); *H01L 2021/60007* (2013.01)

(58) Field of Classification Search
CPC .... H05K 3/0094; H05K 1/0201; H05K 1/115; H05K 3/4038; H01L 21/486; H01L 21/76877; H01L 23/3732; H01L 23/3738; H01L 23/3731; H01L 2021/60007; Y10T 29/49155; Y10T 29/49165
USPC .......... 29/830, 840, 846, 852; 174/252, 260, 174/262; 361/748; 257/713
See application file for complete search history.

(56) References Cited

U.S. PATENT DOCUMENTS

| | | | |
|---|---|---|---|
| 4,396,936 A | * | 8/1983 | McIver ............... H01L 23/3736 174/260 |
| 5,561,322 A | | 10/1996 | Wilson |
| | | (Continued) | |

FOREIGN PATENT DOCUMENTS

EP  2294496 A2  3/2011

OTHER PUBLICATIONS

Pending U.S. Appl. No. 14/668,017, filed Mar. 25, 2015, Entitled "Glass Interposer With Embedded Thermoelectric Devices".

(Continued)

*Primary Examiner* — Donghai D Nguyen
(74) *Attorney, Agent, or Firm* — Scully Scott Murphy and Presser; Frank Digiglio

(57) ABSTRACT

The present invention relates generally to integrated circuit (IC) chip packaging, and more particularly, to a structure and method of forming a glass interposer having thermally conductive vias in addition to electrically conductive vias. The thermally conductive vias help dissipate heat from one or more IC chips, through the glass interposer, into an organic carrying, and then, into an underlying substrate where it can be dissipated.

10 Claims, 25 Drawing Sheets

(56) References Cited

U.S. PATENT DOCUMENTS

| | | | |
|---|---|---|---|
| 5,915,462 | A | 6/1999 | Hernandez |
| 6,711,812 | B1 * | 3/2004 | Lu .................. H01L 23/3677 |
| | | | 174/262 |
| 7,405,474 | B1 | 7/2008 | Brophy |
| 7,459,346 | B2 | 12/2008 | Yee et al. |
| 7,781,883 | B2 | 8/2010 | Sri-Jayantha et al. |
| 8,022,532 | B2 | 9/2011 | Kasuya et al. |
| 8,584,354 | B2 * | 11/2013 | Cornejo .................. C03C 15/00 |
| | | | 29/846 |
| 8,709,865 | B2 | 4/2014 | Hu et al. |
| 2013/0025839 | A1 | 1/2013 | Egitto et al. |
| 2013/0343000 | A1 | 12/2013 | Shi et al. |
| 2014/0015106 | A1 | 1/2014 | Hsieh et al. |

OTHER PUBLICATIONS

Sato et al., "Ultra-Miniaturized and Surface-Mountable Glass-Based 3D IPAC Packages for RF Modules", IEEE 63rd Electronic Components and Technology Conference (ECTC), pp. 1656-1661 (2013).

Cho et al., "Experimental Demonstration of the Effect of Copper TPVs (Through Package Tias) on Thermal Performance of Glass Interposers", IEEE 64th Electronic Components and Technology Conference (ECTC), pp. 1247-1252 (2014).

Hisada et al., "Effect of Thermal Properties of Interposer Material on Thermal Performance of 2.5 D Package", IEEE 2014 International Conference on Electronics Packaging (ICEP 2014), (pp. 429-433 (2014).

* cited by examiner

METHOD OF FORMING A GLASS INTERPOSER WITH THERMAL VIAS

BACKGROUND

The present invention relates generally to integrated circuit (IC) chip packaging, and more particularly, to a structure and method of forming a glass interposer having thermally conductive vias to help dissipate heat in multi-dimensional chip packages.

Multi-layer electronic components are typically joined together by soldering pads on a surface of one of the electronic components to corresponding pads on the surface of the other component. Broadly stated, one or more integrated circuit (IC) chips (i.e., dies) are typically connected to an organic carrier through an interposer. The organic carrier may be electrically connected to a single or multi-layer substrate, such as a printed circuit board (PCB). Pads on the IC chips may be electrically and mechanically connected to corresponding pads on the interposer by a plurality of plurality of small-pitch electrical connections (i.e., micro-solder connections). The interposer may then be electrically and mechanically connected to the organic carrier by larger pitch solder connections.

Therefore, the pitch of the solder connections on the top side of the glass interposer (joined to the IC chip) is typically smaller than the pitch of the solder connections on the bottom side of the glass interposer (joined to the organic carrier). Multi-dimensional packages with interposers that use through silicon vias (TSVs) as an electrical pathway from the IC chips to the organic carrier are typically regarded as 2.5D packages.

SUMMARY

According to an embodiment, a method is disclosed. The method may include: forming vias in a glass interposer; filling the vias with a thermally conductive material, wherein the thermally conductive material is electrically insulating; removing the thermally conductive material from a portion of the vias; and depositing an electrically conductive material in the portion of the vias, on the thermally conductive material, and on the glass interposer.

According to another embodiment, a method of dissipating heat from one or more integrated circuit (IC) chips in a 2.5 dimensional package into an underlying substrate is disclosed. The method may include: joining an organic carrier to the underlying substrate using solder connections; joining a glass interposer to the organic carrier using solder connections, the glass interposer comprising a mixture of thermally conductive/electrically insulating vias and electrically conductive vias, wherein the thermally conductive/electrically insulating vias provide a pathway for heat transfer; and joining the one or more IC chips to the glass interposer using micro-solder connections.

According to another embodiment, a structure is disclosed. The structure may include: a glass interposer; one or more thermally conductive vias extending through an entire thickness of the glass interposer, the one or more thermally conductive vias comprising a thermally conductive material; one or more electrically conductive vias extending through the entire thickness of the glass interposer, the one or more electrically conductive vias comprising a conductive metal; a seed layer on the thermally conductive vias and the glass interposer, the seed layer located between the thermally conductive vias and the conductive metal and between the glass interposer and the conductive metal; and one or more insulators on the glass interposer, the one or more insulators extending through the seed layer and the conductive metal.

BRIEF DESCRIPTION OF THE SEVERAL VIEWS OF THE DRAWINGS

The following detailed description, given by way of example and not intended to limit the invention solely thereto, will best be appreciated in conjunction with the accompanying drawings, in which not all structures may be shown.

FIG. 11 is a cross section view of a structure including an interposer, according an embodiment of the present invention.

The drawings are not necessarily to scale. The drawings are merely schematic representations, not intended to portray specific parameters of the invention. The drawings are intended to depict only typical embodiments of the invention. In the drawings, like numbering represents like elements.

DETAILED DESCRIPTION

Figure 1:
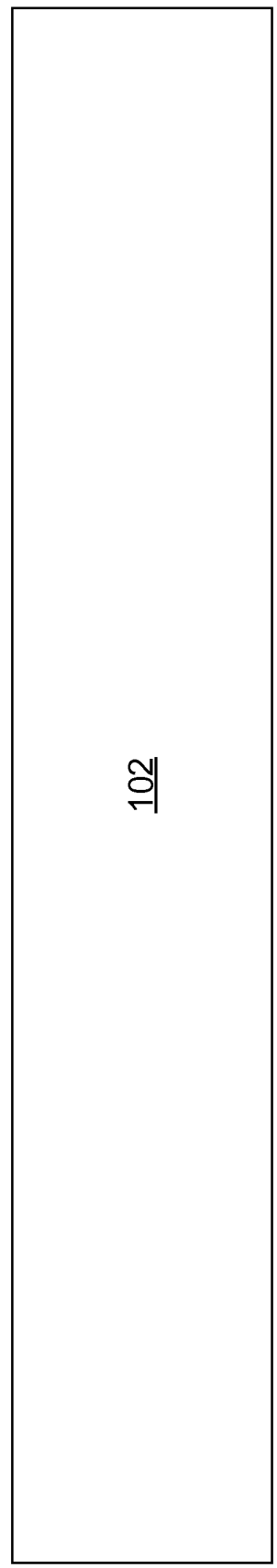
FIG. 1 is a cross section view of a structure including an interposer, according an embodiment of the present invention.

Detailed embodiments of the claimed structures and methods are disclosed herein; however, it can be understood that the disclosed embodiments are merely illustrative of the claimed structures and methods that may be embodied in various forms. This invention may, however, be embodied in many different forms and should not be construed as limited to the exemplary embodiments set forth herein. Rather, these exemplary embodiments are provided so that this disclosure will be thorough and complete and will fully convey the scope of this invention to those skilled in the art.

For purposes of the description hereinafter, the terms "upper", "lower", "right", "left", "vertical", "horizontal", "top", "bottom", and derivatives thereof shall relate to the disclosed structures and methods, as oriented in the drawing figures. It will be understood that when an element such as a layer, region, or substrate is referred to as being "on", "over", "beneath", "below", or "under" another element, it may be present on or below the other element or intervening elements may also be present. In contrast, when an element is referred to as being "directly on", "directly over", "directly beneath", "directly below", or "directly contacting" another element, there may be no intervening elements present. Furthermore, the terminology used herein is for the purpose of describing particular embodiments only and is not intended to be limiting of the invention. As used herein, the singular forms "a," "an," and "the" are intended to include the plural forms as well, unless the context clearly indicates otherwise.

In the interest of not obscuring the presentation of embodiments of the present invention, in the following detailed description, some processing steps or operations that are known in the art may have been combined together for presentation and for illustration purposes and in some instances may have not been described in detail. In other instances, some processing steps or operations that are known in the art may not be described at all. It should be understood that the following description is rather focused on the distinctive features or elements of various embodiments of the present invention.

The present invention relates generally to integrated circuit (IC) chip packaging, and more particularly, to a structure and method of forming a glass interposer having thermally conductive vias to help dissipate heat in multi-dimensional chip packages. Interposers have typically been fabricated from silicon, but as 2.5D technologies expand, glass interposers are emerging as a competitive high performance low-cost option used for their superior electrical insulation.

However, because of their poor thermal conductivity, glass interposers may face thermal challenges for applications that do not have an exposed die and heat sink. For example, mobile applications that use a chip-interposer-substrate package are typically sealed off by a protective mold compound (i.e., overmolded). These chip-interposer-substrate packages use the underlying PCB for cooling, but because of the poor thermal conductivity of glass interposers, the heat cannot travel into the PCB efficiently. This may lead to overheating and other performance problems.

Embodiments of the present invention may use thermally conductive vias formed in the glass interposer to improve heat transfer from active devices in chip into the organic carrier and PCB. Thermally conductive vias may use a material that is thermally conductive, but electrically insulating. Methods of improving heat transfer and reducing junction temperature for overmolded applications using a glass interposer with thermally conductive vias are described below in detail with reference to FIGS. 1-22D. An embodiment in which the thermally conductive vias are formed by etching through an interposer is described below with reference to FIGS. 1-10. An embodiment in which the thermally conductive vias are formed in an interposer by backside exposure is described below with reference to FIGS. 10-20.

Referring now to FIG. 1, a cross section view of a structure 100, which may illustrate a preliminary step in the following process is shown. The structure 100 may include a portion of an interposer 102, preferably composed of glass. The interposer 102 may be a conventional glass interposer and may be composed of a conventional material typically used for glass interposers, such as, for example $SiO_2$ doped with various oxides. In an embodiment, the interposer 102 may have a composition that results in a coefficient of thermal expansion (CTE) that closely matches silicon. The interposer 102 may be made by a glass manufacturing system that uses a fusion process to fabricate glass sheets which can be cut into the desired shape of the interposer 102. The interposer 102 may have any desired shape, such as, for example, a 300 mm diameter circle, or a square/rectangular panel with dimensions of approximately 500×500 mm, although larger or smaller panels are considered. Alternatively, the interposer 102 can be manufactured by any glass manufacturing system and then polished or etched to a desired uniform thickness. In an embodiment, the glass interposer 102 may have a thickness ranging from approximately 50 µm to approximately 700 µm.

Figure 2:
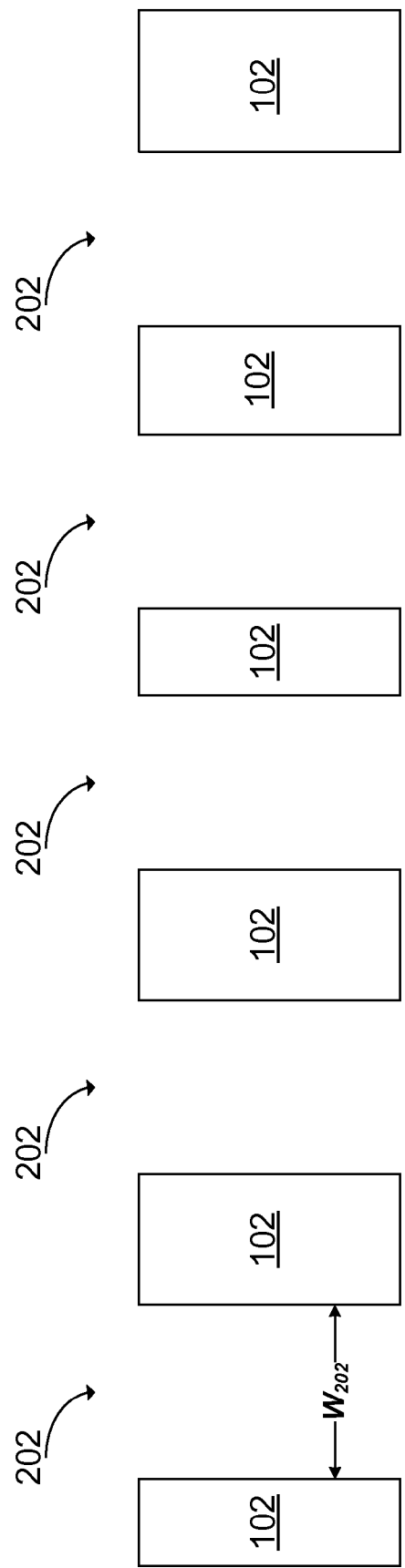
FIG. 2 is a cross section view illustrating forming vias in the interposer, according an embodiment of the present invention.

Referring now to FIG. 2, a cross section view illustrating forming vias 202 in the interposer 102 is shown. The vias 202 may extend through an entire thickness of the interposer 102. In an embodiment, the vias 202 may be formed using a conventional etching process, such as, for example, electrostream drilling (ESD) etching, reactive ion etching (RIE), or photolithography in embodiments in which a photosensitive glass interposer is used. In another embodiment, the vias 202 may be formed using a laser etching process. The vias 202 may have a width $W_{202}$ ranging from approximately 10 µm to approximately 300 µm, with wider widths being preferred to allow for better thermal transfer.

Figure 3:
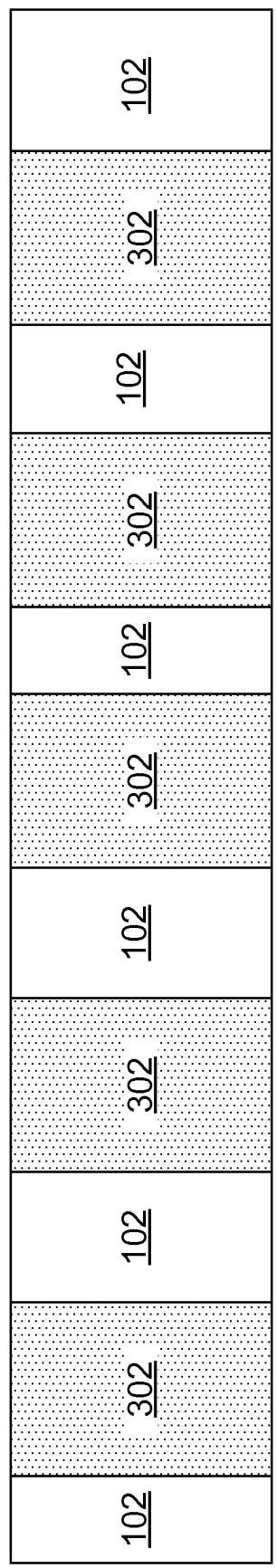
FIG. 3 is a cross section view illustrating filling the vias with a thermally conductive material to form thermally conductive vias, according an embodiment of the present invention.

Referring now to FIG. 3, a cross section view illustrating filling the vias 202 (FIG. 2) with a thermally conductive material to form thermally conductive vias 302 is shown. The thermally conductive vias 302 may be composed of a conventional thermally conductive material that is also electrically insulating, such as, for example, polysilicon, aluminum nitride, or diamond-like carbon. The thermally conductive material may be deposited in the vias 202 using a conventional deposition technique, such as, for example, atomic layer deposition (ALD), chemical vapor deposition (CVD), plasma enhanced vapor deposition (PECVD), physical vapor deposition (PVD), molecular beam deposition (MBD), pulsed laser deposition (PLD), liquid source misted chemical deposition (LSMCD), or sputtering. After the thermally conductive material is deposited, a conventional planarization process, such as, chemical mechanical planarization (CMP) may be performed such that an upper surface and a lower surface of the thermally conductive vias 302 are substantially flush with an upper surface and a lower surface of the interposer 102. It should be noted that although the thermally conductive vias 302 are illustrated with a rectangular profile in FIG. 3, it should be understood that the thermally conductive vias 302 can have an annular profile or may be a bar via.

Figure 4:
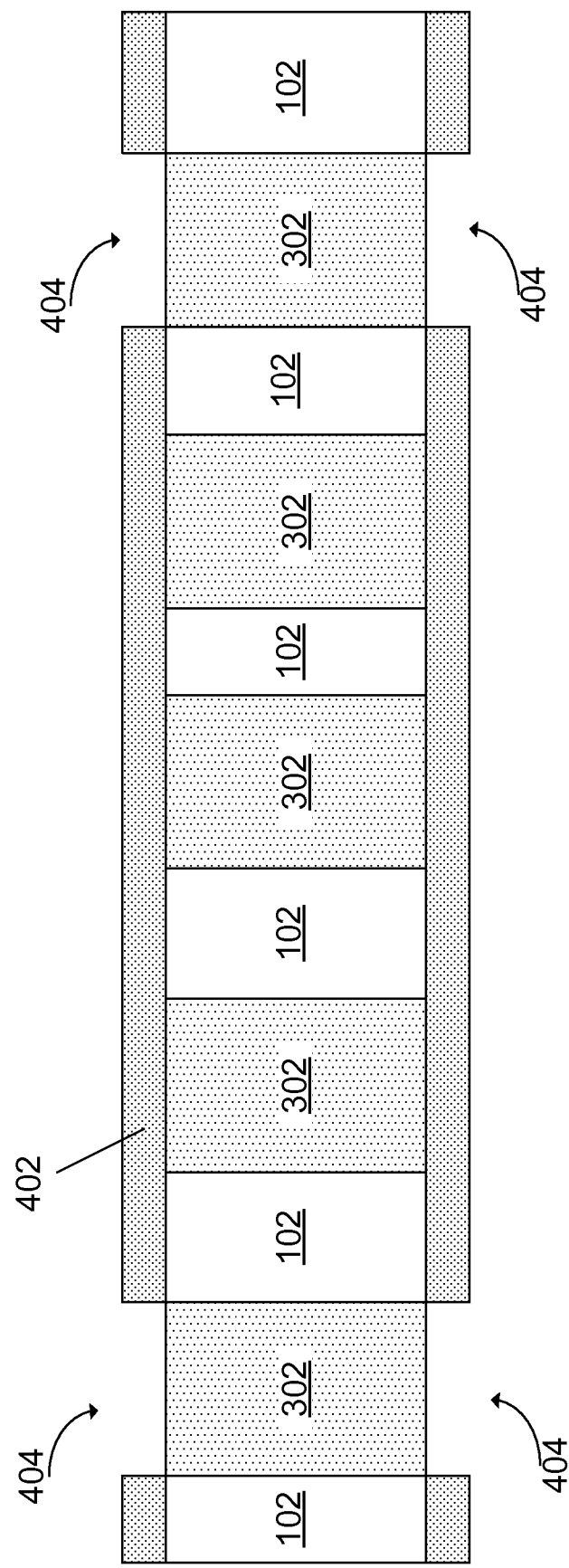
FIG. 4 is a cross section view illustrating forming a etch stop layer on portions of the interposer and a number of the thermally conductive vias, according an embodiment of the present invention.

Referring now to FIG. 4, a cross section view illustrating forming a etch stop layer 402 on portions of the interposer 102 and a number of the thermally conductive vias 302 is shown. The etch stop layer may be composed of an oxide or a nitride and may be formed using a conventional deposition process, such as, for example, ALD, CVD, PECVD, PVD, MBD, PLD, LSMCD, or sputtering. In an embodiment, one or more openings 404 (hereinafter "openings") may be formed in the etch stop layer 402 using a conventional patterning and etching process. The openings 404 may expose one or more thermally conductive vias 302.

Figure 5:
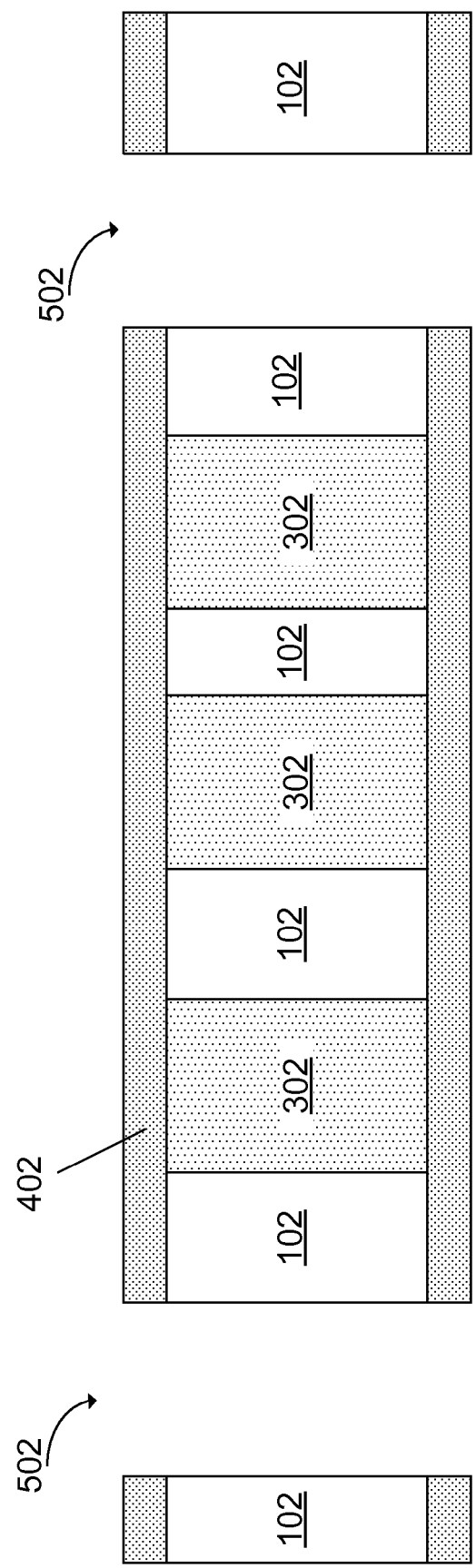
FIG. 5 is a cross section view illustrating removing the exposed thermally conductive vias to form one or more openings, according an embodiment of the present invention.

Referring now to FIG. 5, a cross section view illustrating removing the exposed thermally conductive vias 302 to form one or more openings 502 (hereinafter "openings") is shown. In an embodiment, the expose thermally conductive vias 302 may be removed selective to the etch stop layer 402 and the interposer 102 using a conventional etching process, such as, for example, RIE or wet etching.

Figure 6:
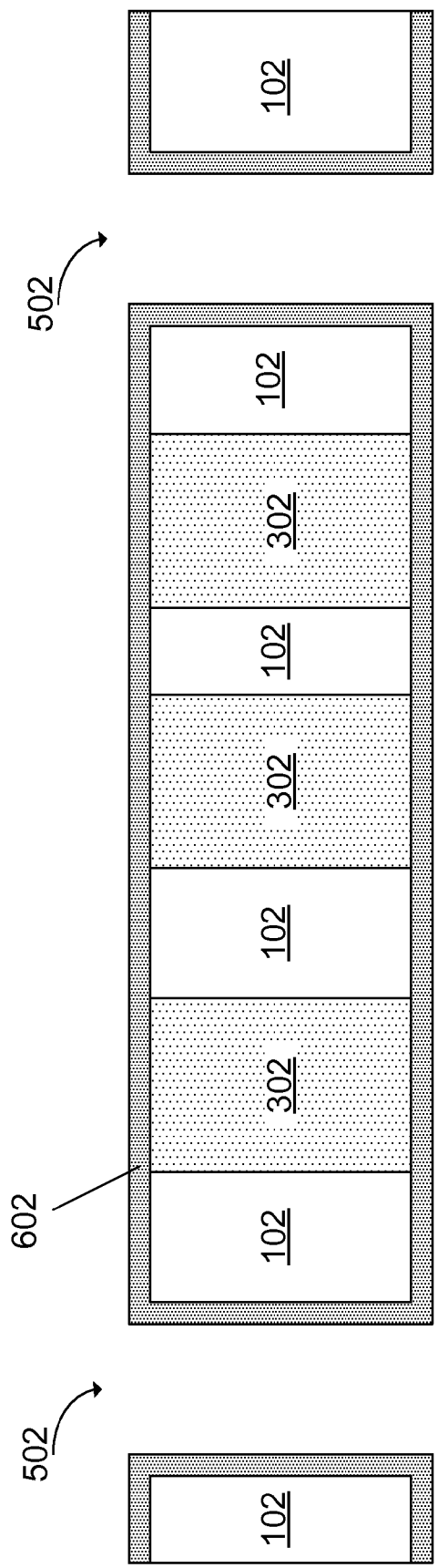
FIG. 6 is a cross section view illustrating forming a seed layer on the interposer, on the thermally conductive vias, and in the openings, according an embodiment of the present invention.

Referring now to FIG. 6, a cross section view illustrating forming a seed layer 602 on the interposer 102, on the thermally conductive vias 302, and in the openings 502 is shown. The seed layer 602 may be composed of an electrically conductive material such as, for example, titanium, copper, cobalt, ruthenium, chromium, gold, platinum, or alloys thereof. The seed layer 602 may be deposited conformally on the interposer 102 and the thermally conductive vias 302 using a conventional deposition process, such as, for example, ALD, CVD, PECVD, PVD, MBD, PLD, LSMCD, plating, or sputtering.

Figure 7:
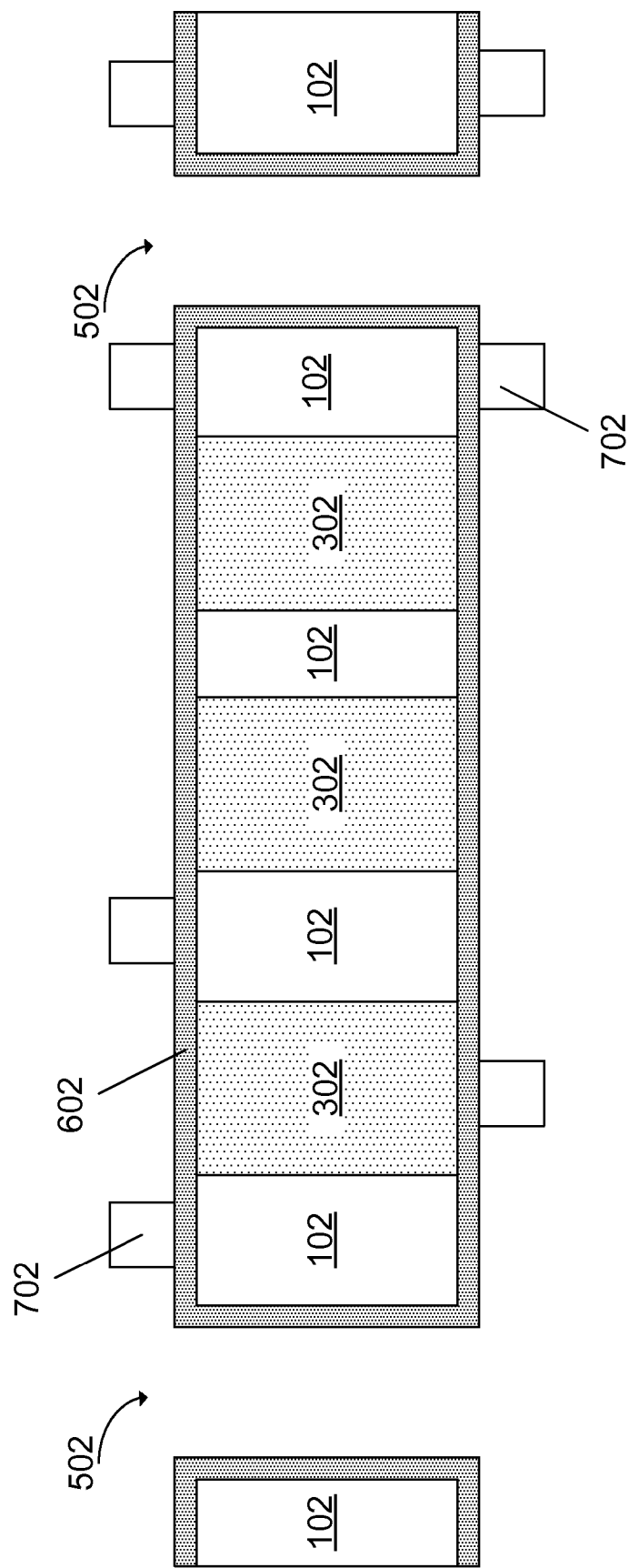
FIG. 7 is a cross section view illustrating forming a patterning layer on the seed layer, according an embodiment of the present invention.

Referring now to FIG. 7, a cross section view illustrating forming a patterning layer 702 on the seed layer 602 is shown. In an embodiment, the patterning layer 702 may be composed of a conventional resist material that has been patterned by, for example, a conventional photolithography process. The resist may be a conventional positive tone or negative tone resist. In another embodiment, the patterning layer 702 may be composed of a hardmask material, an oxide, or a nitride.

Figure 8:
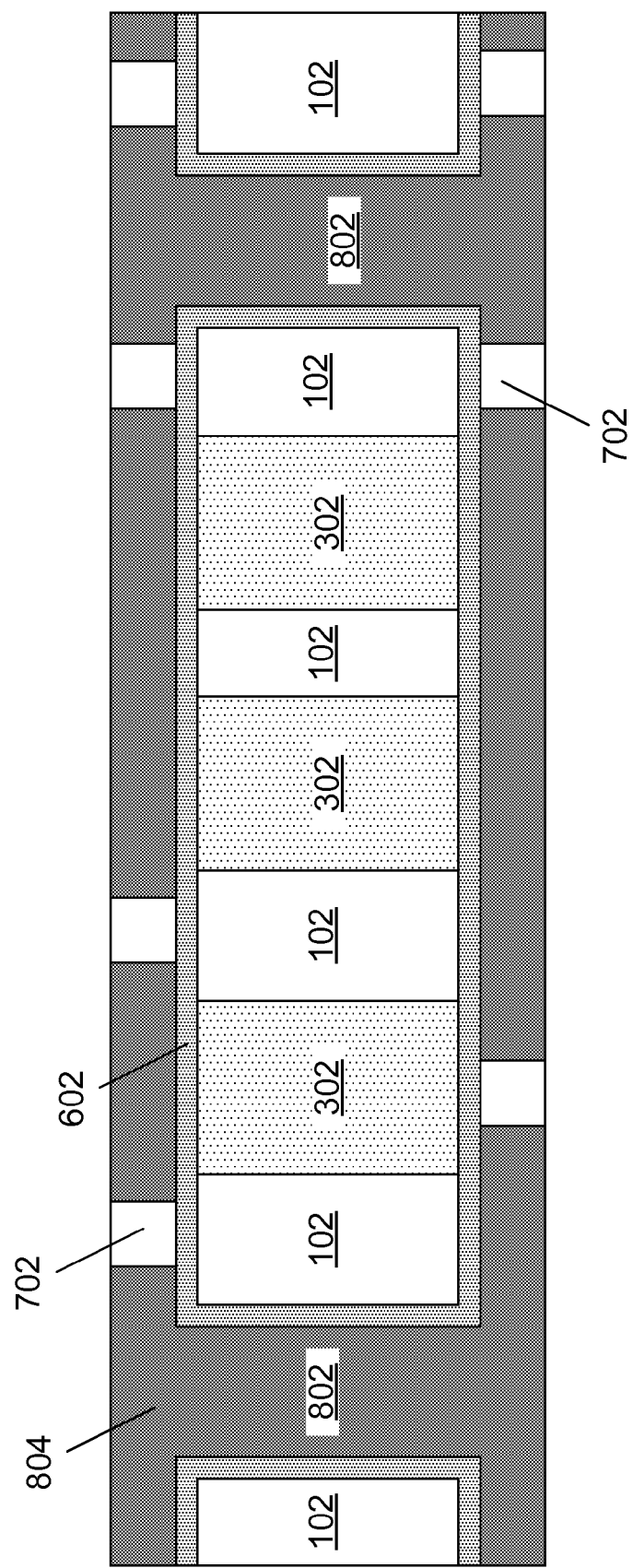
FIG. 8 is a cross section view illustrating depositing an electrically conductive material on the seed layer and in the openings to form one or more electrically conductive vias, according an embodiment of the present invention.

Referring now to FIG. 8, a cross section view illustrating depositing an electrically conductive material 804 on the seed layer 602 and in the openings 502 (FIG. 7) to form one or more electrically conductive vias 802 (hereinafter "electrically conductive vias") is shown. In an embodiment, the electrically conductive material 804 may be composed of a metal, such as, for example, copper, aluminum, titanium, platinum, or alloys thereof. The electrically conductive material 804 may be deposited using a conventional deposition process, such as, for example, ALD, CVD, PECVD, PVD, MBD, PLD, LSMCD, plating, or sputtering. After the electrically conductive material 804 is deposited, it may be planarized using a conventional planarization techniques, such as CMP, such that an upper surface of the electrically conductive material 804 is substantially flush with an upper surface of the patterning layer 702.

Figure 9:
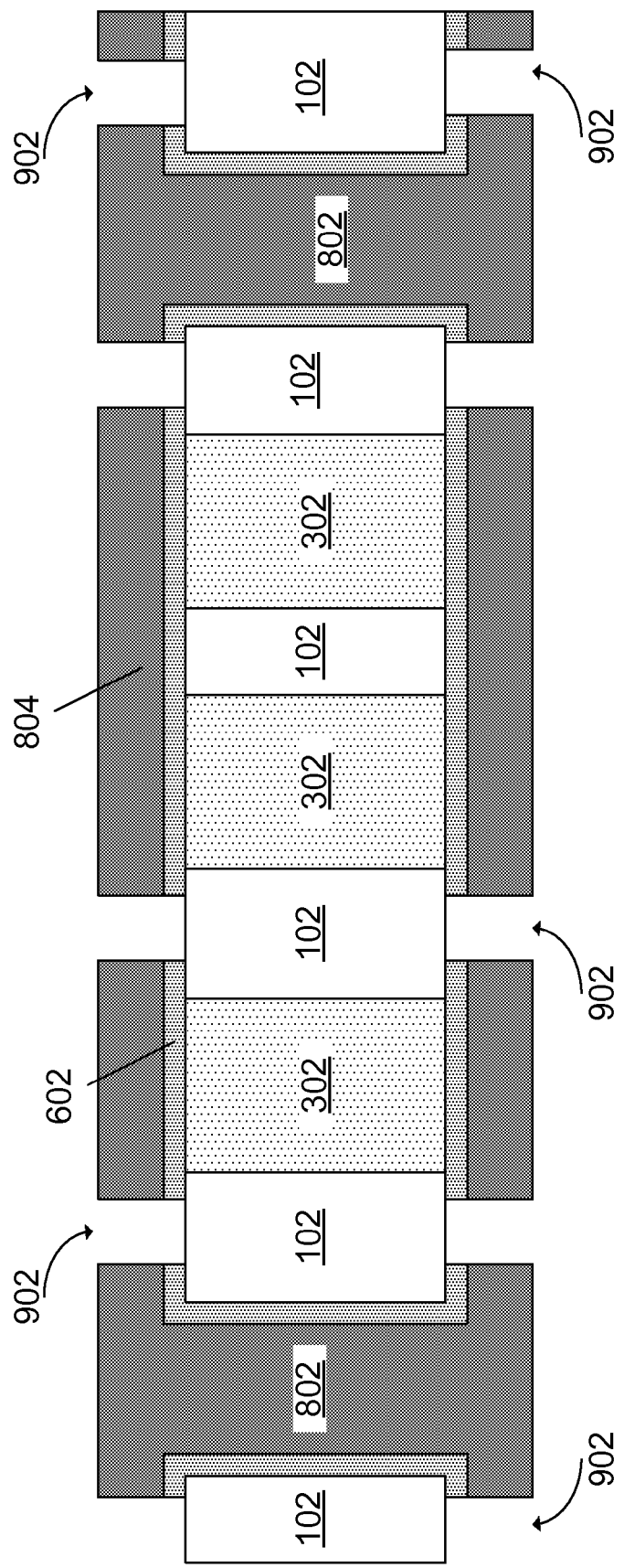
FIG. 9 is a cross section view illustrating removing the patterning layer and underlying portions of the seed layer to form one or more openings, according an embodiment of the present invention.

Referring now to FIG. 9, a cross section view illustrating removing the patterning layer 702 (FIG. 8) and underlying portions of the seed layer 602 to form one or more openings 902 (hereinafter "openings") is shown. In an embodiment, the patterning layer 702 and underlying portions of the seed layer 602 may be removed, selective to the electrically conductive material 804, using a conventional etching process, such as RIE, wet etching, or stripping. The openings 902 may expose the upper surface and the lower surface of the interposer 102 and may separate portions of the electrically conductive material 804 from one another.

Figure 10:
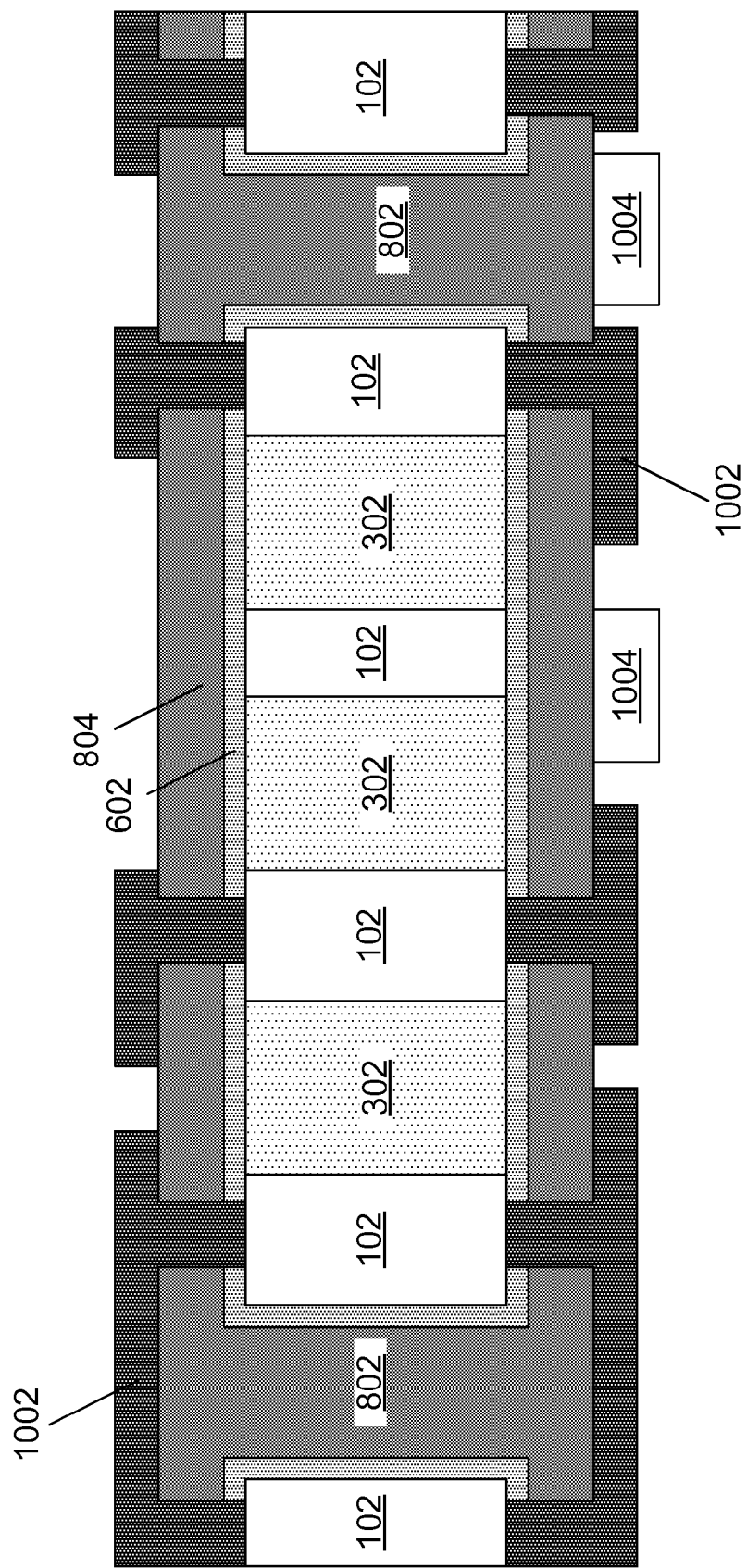
FIG. 10 is a cross section view illustrating forming an insulator on the electrically conductive material and in the openings, according an embodiment of the present invention.

Referring now to FIG. 10, a cross section view illustrating forming an insulator 1002 on the electrically conductive material 804 and in the openings 902 (FIG. 9) is shown. In an embodiment, the insulator 1002 may be composed of an electrically insulating material, such as, for example, a polyimide or a low-k dielectric. The insulator 1002 may be deposited using a conventional deposition technique, such as, for example, ALD, CVD, PECVD, PVD, MBD, PLD, LSMCD, plating, or sputtering. The insulator 1002 may be patterned so as to leave portions of the electrically conductive material 804 exposed. In an embodiment, one or more solder connections 1004 (hereinafter "solder connections") may be formed on the exposed portions of the electrically conductive material 804. The solder connections 1004 may be formed using conventional techniques, and may be composed of one or more layers of conductive material.

In another embodiment, as described below with reference to FIGS. 11-20 the thermally conductive vias may be formed in an interposer by backside exposure.

Figure 11:
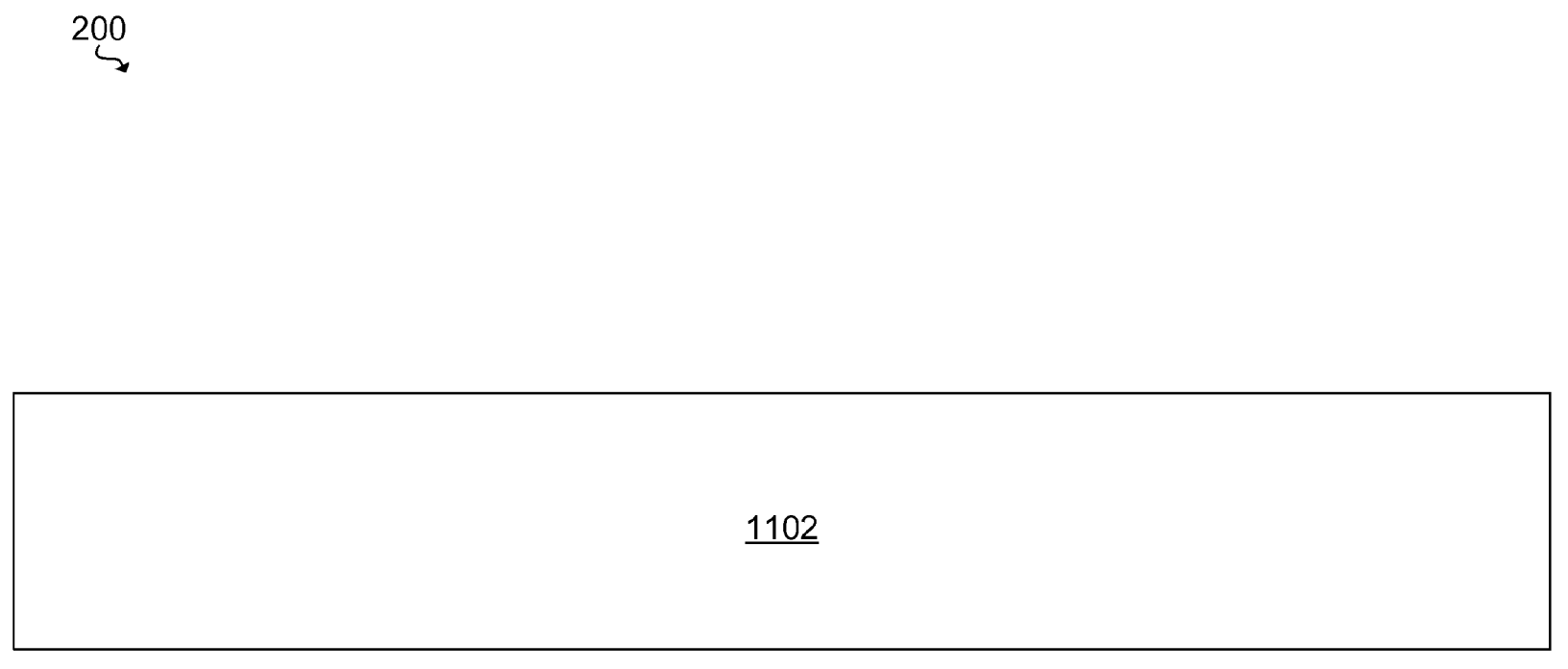

Referring now to FIG. 11, a cross section view of a structure 200, which may illustrate a preliminary step in the following process is shown. The structure 200 may include a portion of an interposer 1102, preferably composed of glass. The interposer 1102 may be a conventional glass interposer and may be composed of a conventional material typically used for glass interposers, such as, for example $SiO_2$ doped with various oxides. In an embodiment, the interposer 1102 may have a composition that results in a coefficient of thermal expansion (CTE) that closely matches silicon. The interposer 1102 may be made by a glass manufacturing system that uses a fusion process to fabricate glass sheets which can be cut into the desired shape of the interposer 1102. The interposer 1102 may have any desired shape, such as, for example, a 300 mm diameter circle, or a square/rectangular panel with dimensions of approximately 500×500 mm, although larger or smaller panels are considered. Alternatively, the interposer 1102 can be manufactured by any glass manufacturing system and then polished or etched to a desired uniform thickness. In an embodiment, the glass interposer 1102 may have a thickness ranging from approximately 50 μm to approximately 700 μm.

Figure 12:
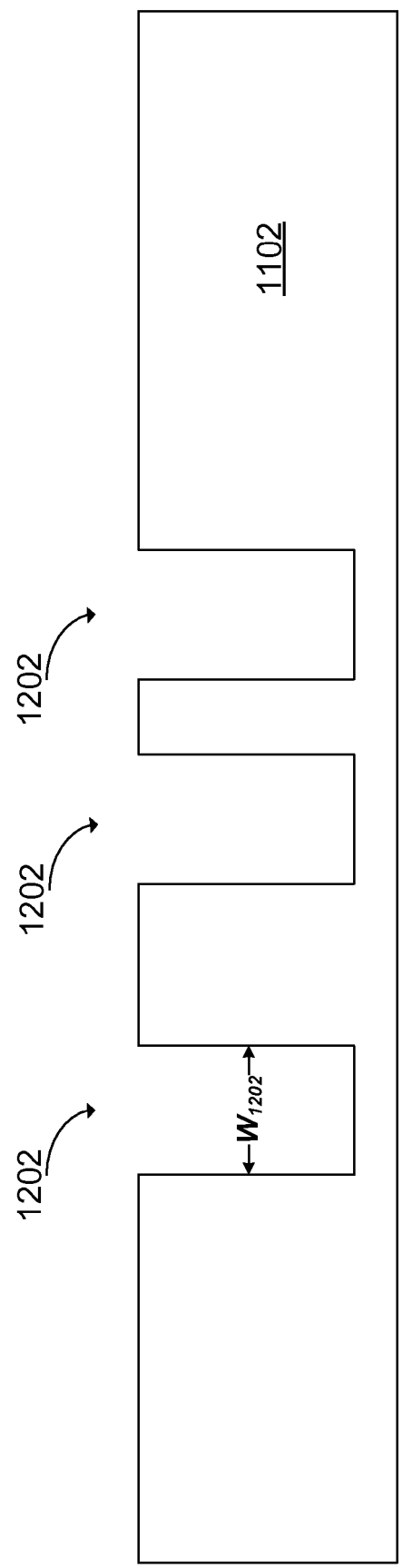
FIG. 12 is a cross section view illustrating forming first vias in the interposer, according an embodiment of the present invention.

Referring now to FIG. 12, a cross section view illustrating forming first vias 1202 in the interposer 1102 is shown. The first vias 1202 may extend through only an upper portion of the thickness of the interposer 1102. The first vias 1202 may have a bottom that is separated from a bottom surface of the interposer 1102 by a lower portion of the interposer 1102. In an embodiment, the first vias 1202 may be formed using a conventional etching process, such as, for example, electrostream drilling (ESD) etching, reactive ion etching (RIE), or photolithography in embodiments in which a photosensitive glass interposer is used. In another embodiment, the first vias 1202 may be formed using a laser etching process. The first vias 1202 may have a width $W_{1202}$ ranging from approximately 10 μm to approximately 300 μm, with wider widths being preferred to allow for better thermal transfer.

Figure 13:
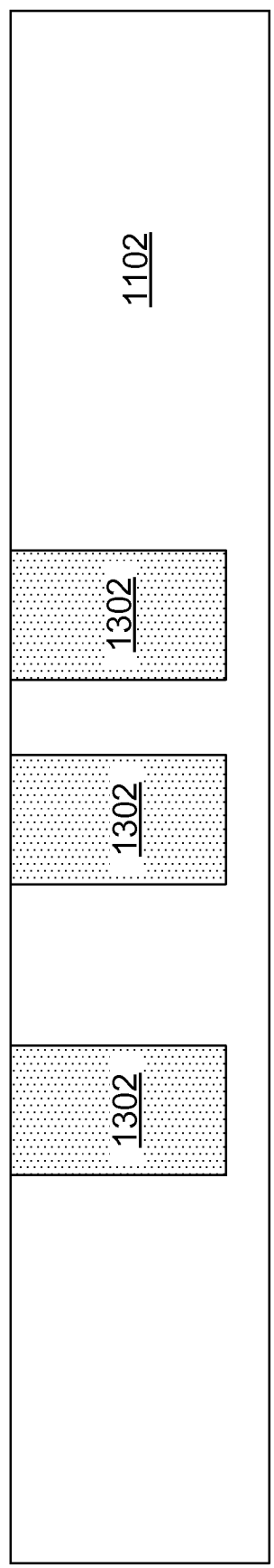
FIG. 13 is a cross section view illustrating filling the first vias with a thermally conductive material to form thermally conductive vias, according an embodiment of the present invention.

Referring now to FIG. 13, a cross section view illustrating filling the first vias 1202 (FIG. 12) with a thermally conductive material to form thermally conductive vias 1302 is shown. The thermally conductive vias 1302 may be composed of a conventional thermally conductive material that is also electrically insulating, such as, for example, polysilicon, aluminum nitride, or diamond-like carbon. The thermally conductive material may be deposited in the first vias 1202 using a conventional deposition technique, such as, for example, ALD, CVD, PECVD, PVD, MBD, PLD, LSMCD, plating, or sputtering. After the thermally conductive material is deposited, a conventional planarization process, such as, chemical mechanical planarization (CMP) may be performed such that an upper surface of the thermally conductive vias 1302 are substantially flush with an upper surface of the interposer 1102. It should be noted that although the thermally conductive vias 1302 are illustrated with a rectangular profile in FIG. 13, it should be understood that the thermally conductive vias 1302 can have an annular profile or may be a bar via.

Figure 14:
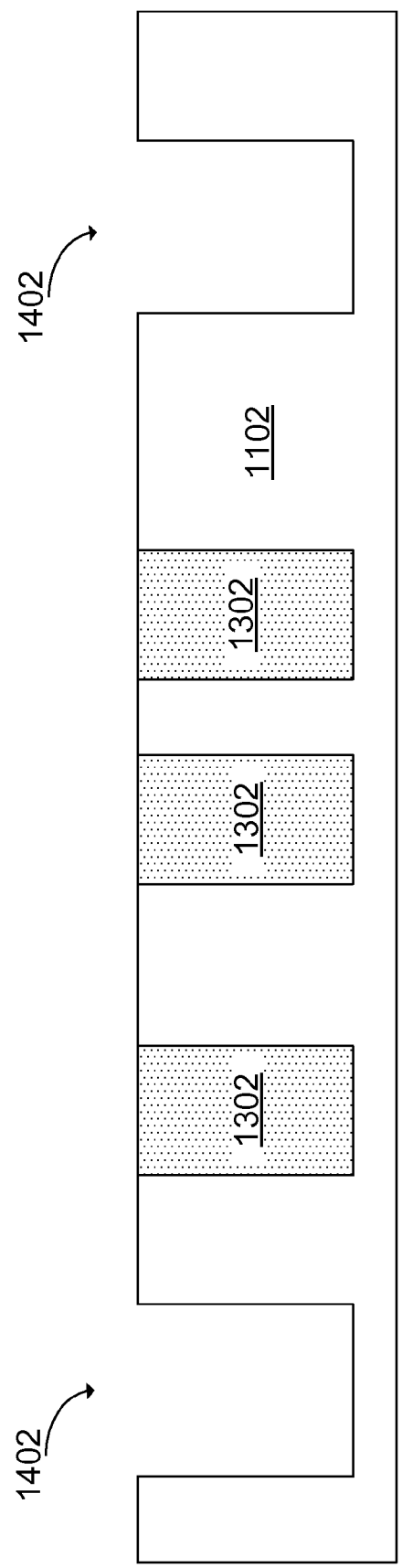
FIG. 14 is a cross section view illustrating forming second vias in the interposer, according an embodiment of the present invention.

Referring now to FIG. 14, a cross section view illustrating forming second vias 1402 in the interposer 1102 is shown. The second vias 1402 may extend through only a portion of the interposer 1102. In an embodiment, the second vias 1402 may be formed using a conventional etching process, such as, for example, electrostream drilling (ESD) etching, reactive ion etching (RIE), or photolithography in embodiments in which a photosensitive glass interposer is used. In another embodiment, the second vias 1402 may be formed using a laser etching process. The second vias 1402 may have a width $W_{1402}$ ranging from approximately 10 μm to approximately 300 μm, with wider widths being preferred to allow for better thermal transfer.

Figure 15:
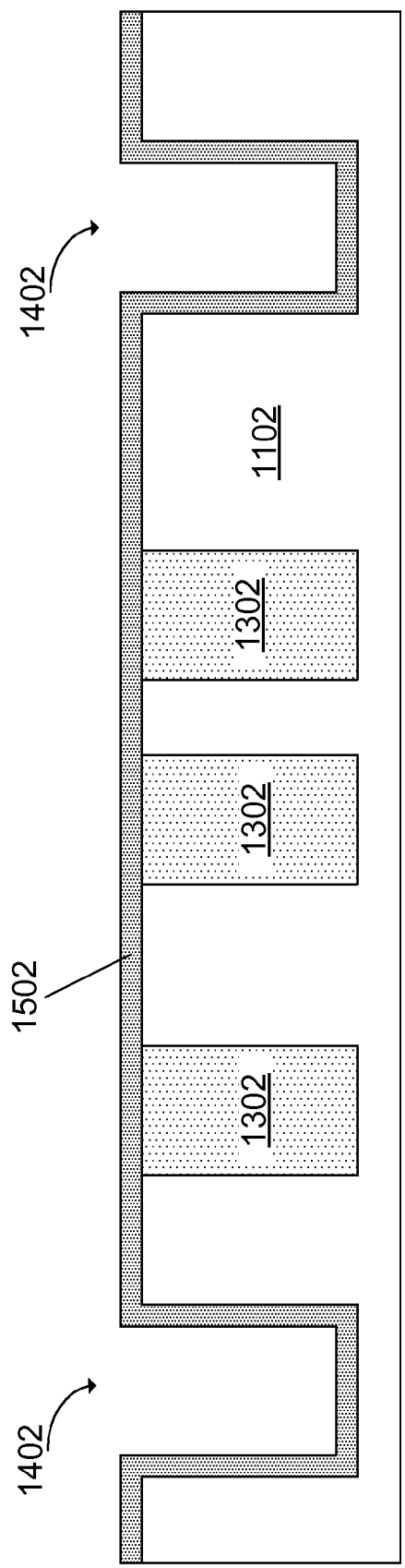
FIG. 15 is a cross section view illustrating forming a seed layer on the interposer, on the thermally conductive vias, and in the second vias, according an embodiment of the present invention.

Referring now to FIG. 15, a cross section view illustrating forming a seed layer 1502 on the interposer 1102, on the thermally conductive vias 1302, and in the second vias 1402 is shown. The seed layer 1502 may be composed of an electrically conductive material such as, for example, titanium, copper, cobalt, ruthenium, chromium, gold, platinum, or alloys thereof. The seed layer 1502 may be deposited conformally on the interposer 1102 and the thermally conductive vias 1302 using a conventional deposition process, such as, for example, ALD, CVD, PECVD, PVD, MBD, PLD, LSMCD, plating, or sputtering.

Figure 16:
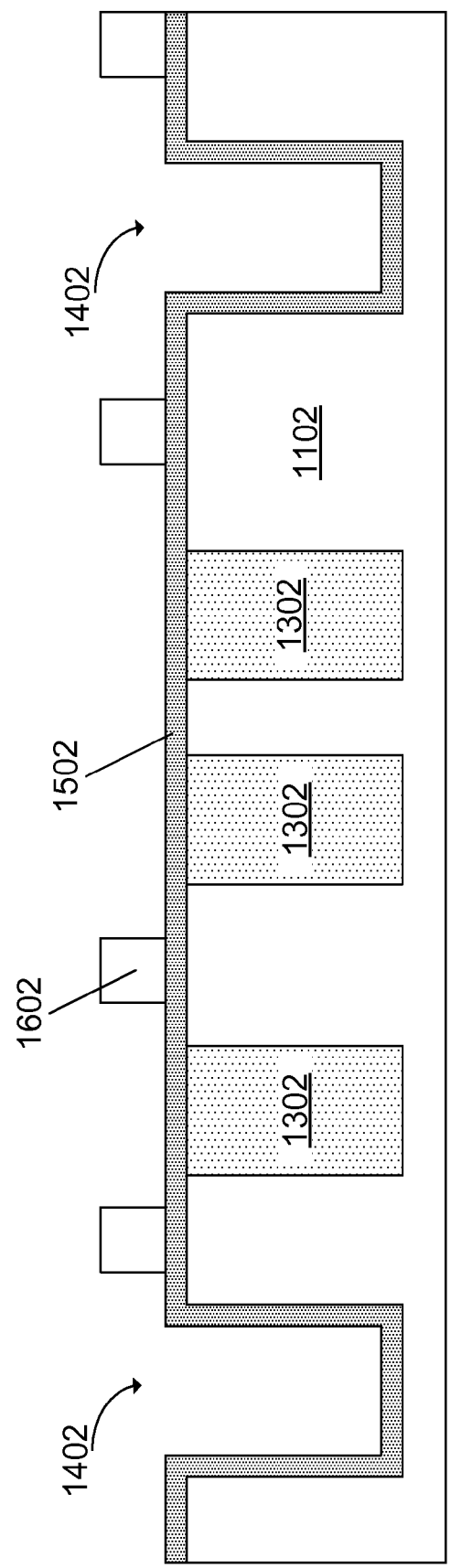
FIG. 16 is a cross section view illustrating forming a patterning layer on the seed layer, according an embodiment of the present invention.

Referring now to FIG. 16, a cross section view illustrating forming a patterning layer 1602 on the seed layer 1502 is shown. In an embodiment, the patterning layer 1602 may be composed of a conventional resist material that has been patterned by, for example, a conventional photolithography process. The resist may be a conventional positive tone or negative tone resist. In another embodiment, the patterning layer 1602 may be composed of a hardmask material, an oxide, or a nitride.

Figure 17:
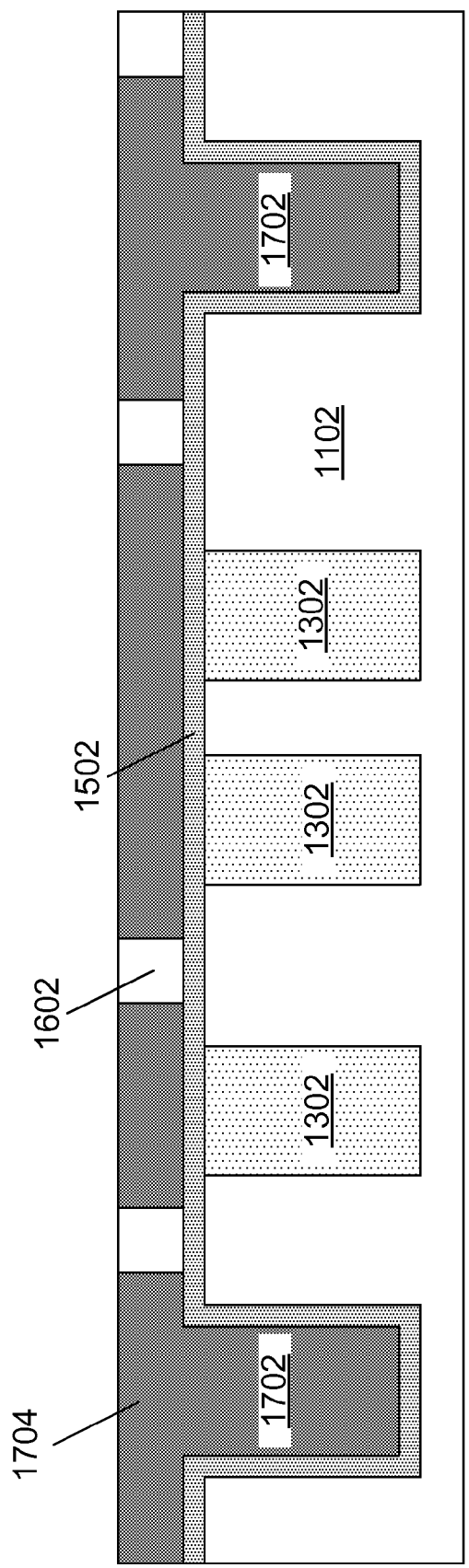
FIG. 17 is a cross section view illustrating depositing an electrically conductive material on the seed layer and in the second vias to form one or more electrically conductive vias, according an embodiment of the present invention.

Referring now to FIG. 17, a cross section view illustrating depositing an electrically conductive material 1704 on the seed layer 1502 and in the second vias 1402 (FIG. 16) to form one or more electrically conductive vias 1702 (hereinafter "electrically conductive vias") is shown. In an embodiment, the electrically conductive material 1704 may be composed of a metal, such as, for example, copper, aluminum, titanium, platinum, or alloys thereof. The electrically conductive material 1704 may be deposited using a conventional deposition process, such as, for example, ALD, CVD, PECVD, PVD, MBD, PLD, LSMCD, plating, or sputtering. After the electrically conductive material 1704 is deposited, it may be planarized using a conventional planarization techniques, such as CMP, such that an upper surface of the electrically conductive material 1704 is substantially flush with an upper surface of the patterning layer 1602.

Figure 18:
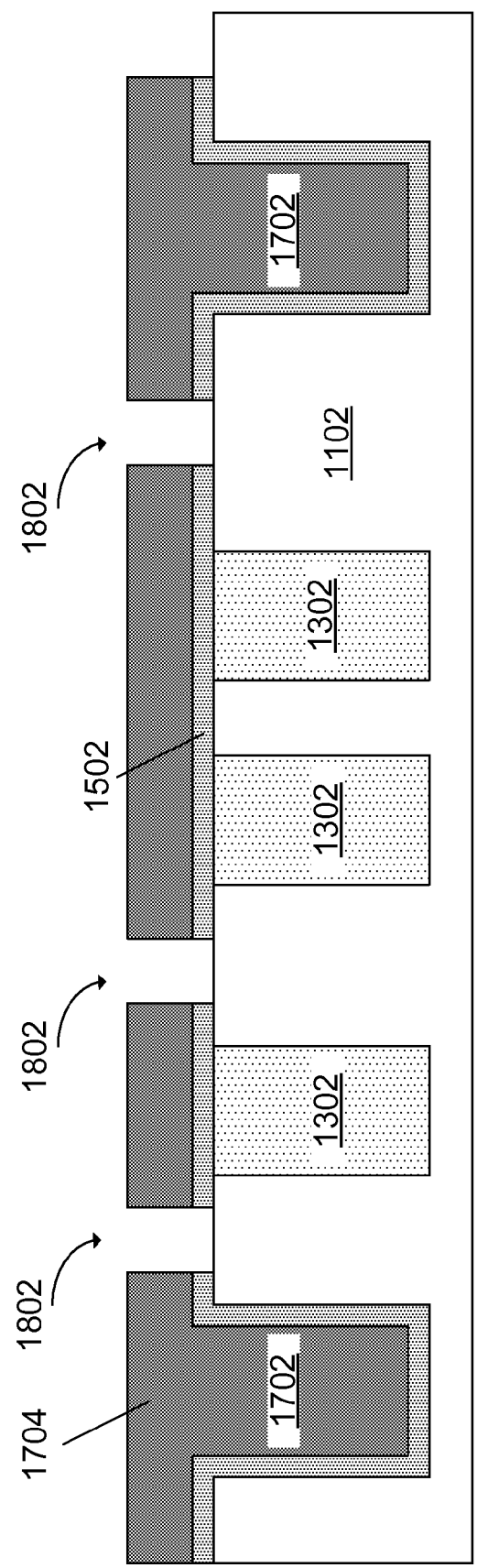
FIG. 18 is a cross section view illustrating removing the patterning layer and underlying portions of the seed layer to form one or more openings, according an embodiment of the present invention.

Referring now to FIG. 18, a cross section view illustrating removing the patterning layer 1602 (FIG. 17) and underlying portions of the seed layer 1502 to form one or more openings 1802 (hereinafter "openings") is shown. In an embodiment, the patterning layer 1602 and underlying portions of the see layer 1602 may be removed, selective to the electrically conductive material 1704, using a conventional etching process, such as RIE, wet etching, or stripping. The openings 1802 may expose the upper surface of the interposer 1102 and may separate portions of the electrically conductive material 1704 from one another.

Figure 19:
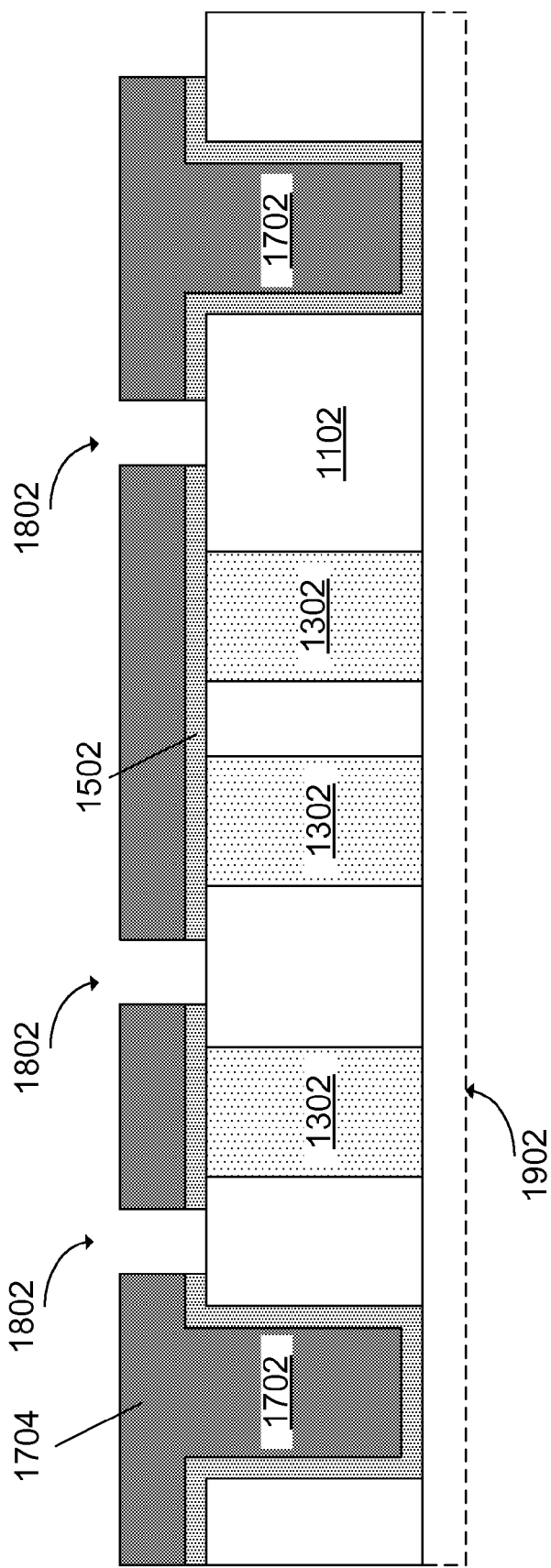
FIG. 19 is a cross section view illustrating removing a portion of the interposer, according an embodiment of the present invention.

Referring now to FIG. 19, a cross section view illustrating removing a portion 1902 of the interposer 1102 is shown. In an embodiment, the portion 1902 of the interposer 1102 may be removed so as to expose a lower surface of the seed layer 1502 below the electrically conductive vias 1702 and a lower surface of the thermally conductive vias 1302. In an embodiment, the portion 1902 of the interposer 1102 may be removed using a conventional etching technique. In another embodiment, the portion 1902 of the interposer 1102 may be removed using a conventional planarization technique, such as, for example, CMP.

Figure 20:
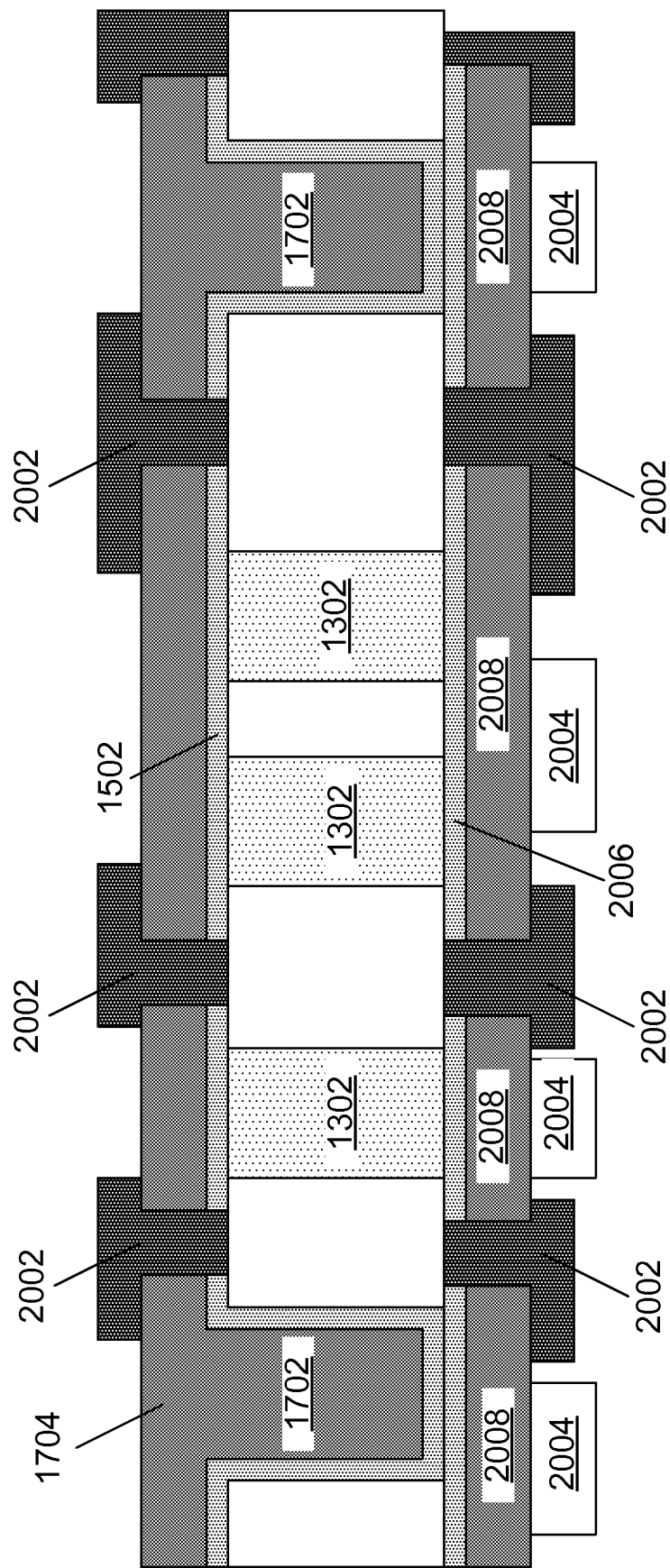
FIG. 20 is a cross section view illustrating forming an insulator on the electrically conductive material and in the openings, according an embodiment of the present invention.

Referring now to FIG. 20, a cross section view illustrating forming a bottom seed layer 2006, a bottom conductive material 2008, and an insulator 2002 is shown. The bottom seed layer 2006 may be substantially similar to the seed layer 1502 and may be formed using substantially similar techniques as those described above with reference to FIG. 15. The bottom conductive material 2008 may be substantially similar to the conductive material 1704 and may be formed using substantially similar techniques as those described above with reference to FIG. 17. The bottom seed layer 2006 and the bottom conductive material 2008 may be patterned and etched to form bottom openings (not shown) that are substantially similar to the openings 1802 (FIG. 18) and may be formed using substantially similar techniques as those described above with reference to FIG. 18.

An insulator 2002 may be formed in the openings 1802 (FIG. 19) and the bottom openings. The insulator 2002 may also be formed on the electrically conductive material 1704 and the bottom conductive material 2008. In an embodiment, the insulator 2002 may be composed of an electrically insulating material, such as, for example, a polyimide or a low-k dielectric. The insulator 2002 may be deposited using a conventional deposition technique, such as, for example, ALD, CVD, PECVD, PVD, MBD, PLD, LSMCD, plating, or sputtering. The insulator 2002 may be patterned so as to leave portions of the electrically conductive material 1704 exposed. In an embodiment, one or more solder connections 2004 (hereinafter "solder connections") may be formed on the exposed portions of the electrically conductive material 1704 on a bottom side of the interposer. The solder connections 2004 may be formed using conventional techniques and may be composed of one or more layers of conductive material.

Figure 21:
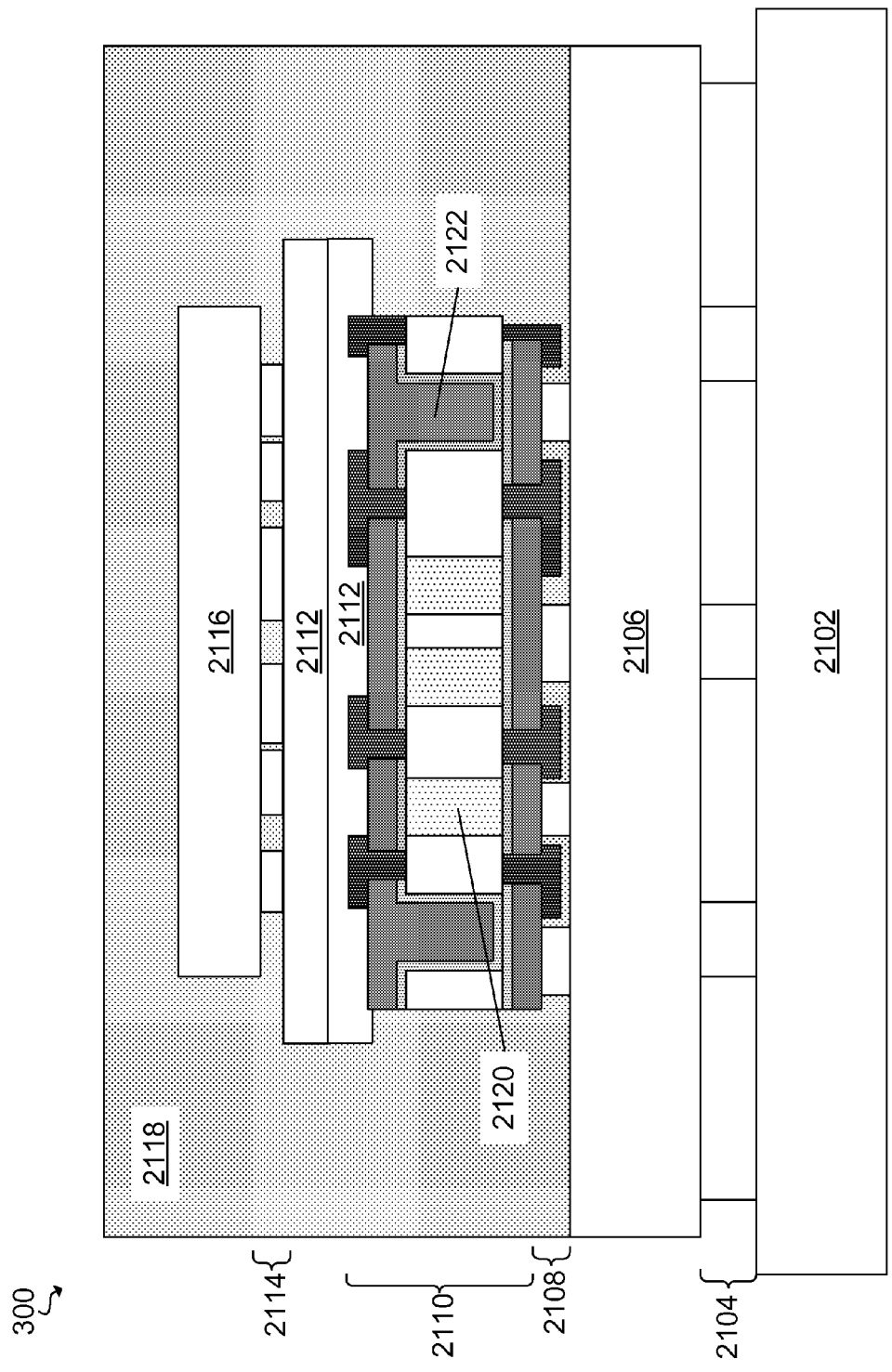
FIG. 21 is a cross section view illustrating a structure, which may be a novel 2.5 dimensional package, according to various embodiments of the present invention.

Referring now to FIG. 21, a cross section view of a structure 300 is shown. In an embodiment, the structure 300 may be a 2.5 dimensional package that includes a glass interposer 2110 with thermally conductive vias 2120. The glass interposer 2110 may correspond to the structures illustrated in FIG. 10 and FIG. 20 above. The glass interposer 2110, therefore, may have a combination of thermally conductive vias 2120, which correspond the thermally conductive vias 302 (FIG. 10) and the thermally conductive vias 1302 (FIG. 20), and electrically conductive vias 2122, which correspond to the electrically conductive vias 802 (FIG. 10) and the electrically conductive vias 1702 (FIG. 20). The structure 300 may also include a substrate 2102, which may be a PCB, joined to an organic carrier 2106 with first solder connections 2104. Both the substrate 2102 and the organic carrier 2106 may have wiring layers (not shown). The organic carrier 2106 may be joined to the glass interposer 2110 by second solder connections 2108. The glass interposer 2110 may have one or more distribution layers 2112 formed thereon, that connects to one or more IC chips 2116 via micro-solder connections 2114. The organic carrier 2106, the glass interposer 2110, the distribution layers 2112, and the one or more IC chips 2116 may be completely covered in a mold compound 2118.

In an embodiment, heat generated by the one or more IC chips 2116 during operation may be transferred through the glass interposer 2110 and into the organic carrier 2106 through the thermally conductive vias 2120, where it may eventually be dissipated into the substrate 2102. Conventional 2.5 dimensional packages that utilize a glass interposer do not have this efficient pathway for heat distribution, which may cause operating problems and even failure.

Figure 22A:
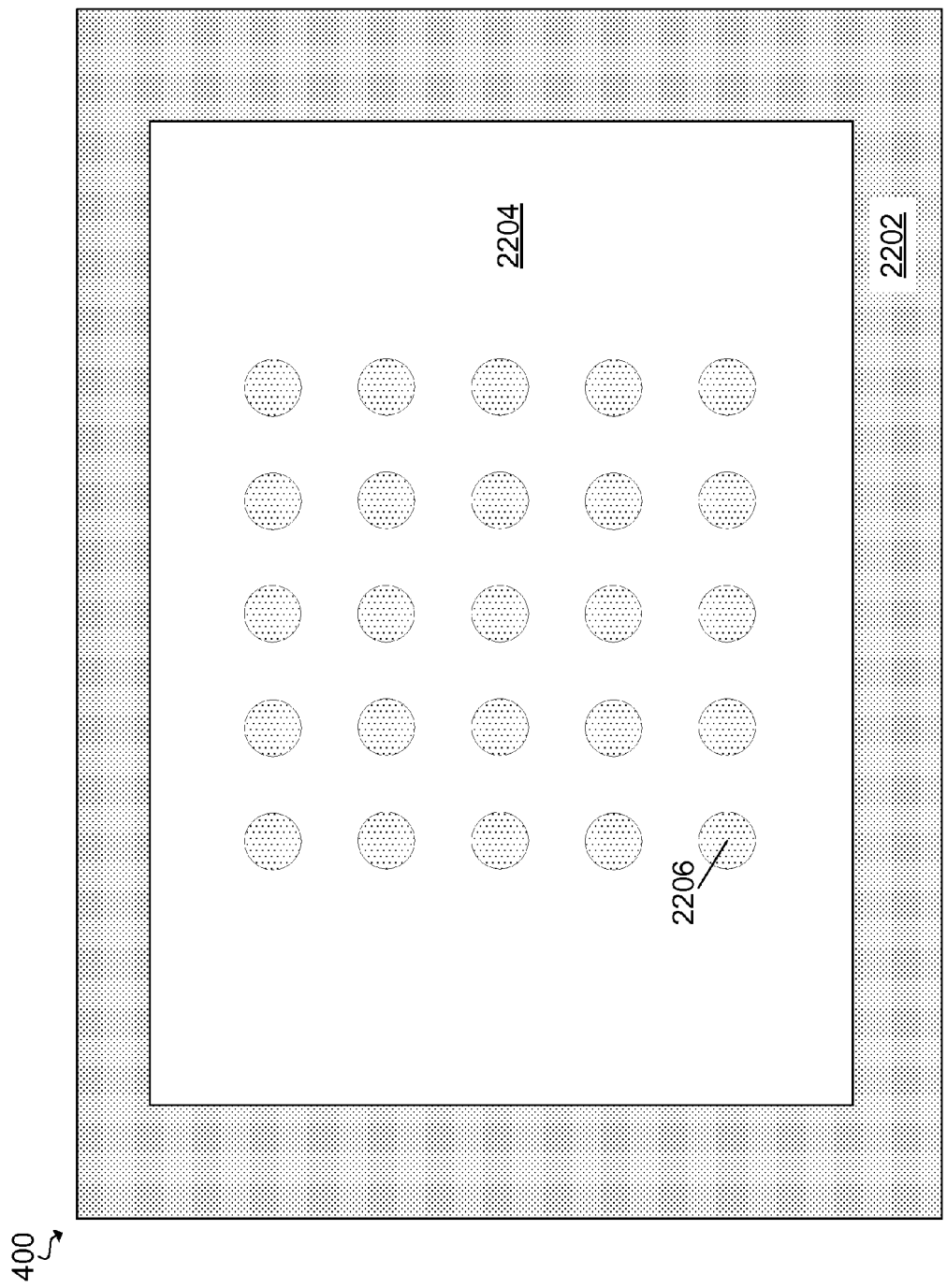
FIGS. 22A-22D are top views illustrating various patterns of the thermally conductive vias that may be formed in the interposer, according to various embodiments of the present invention.
Figure 22B:
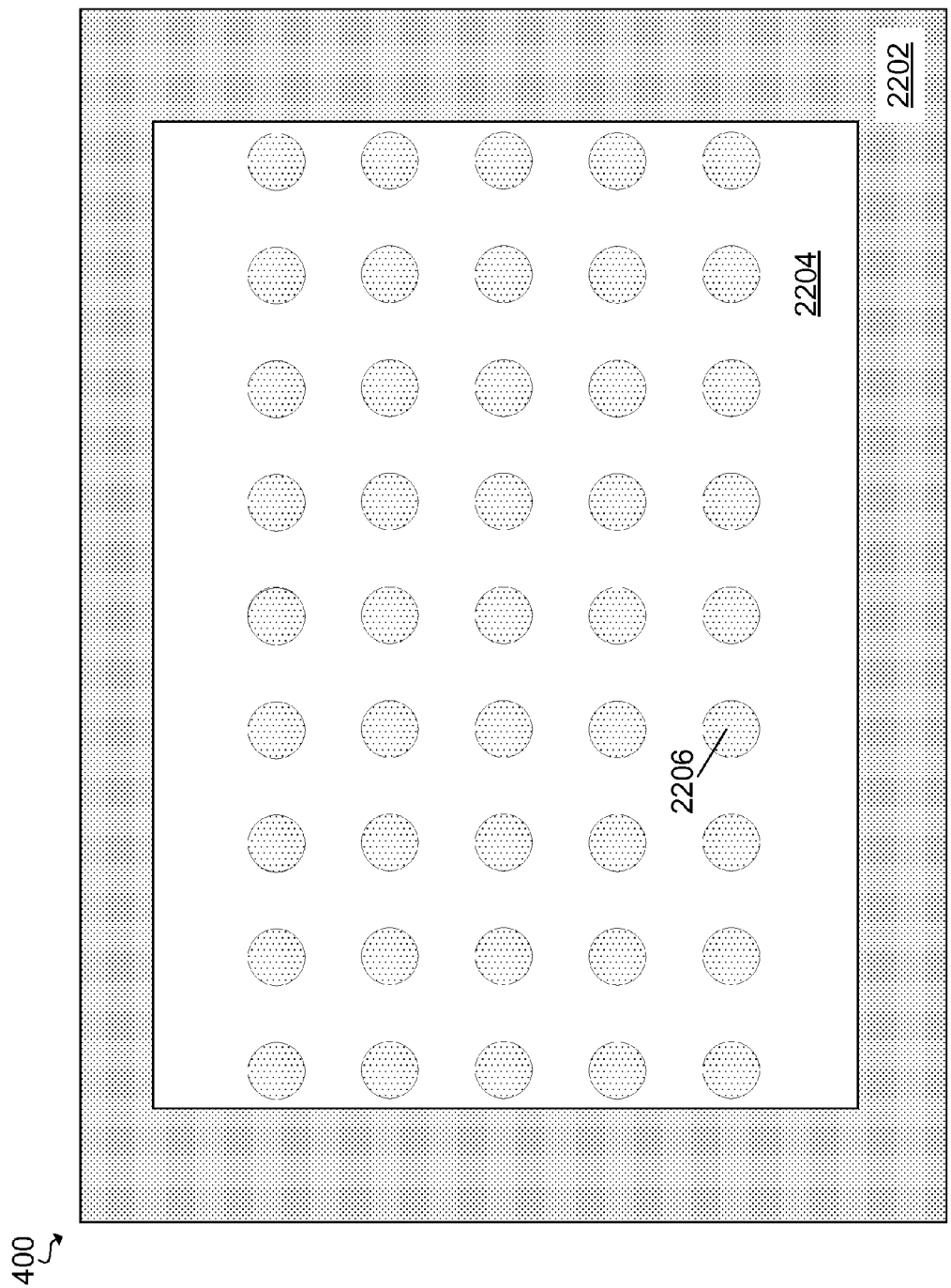
Figure 22C:
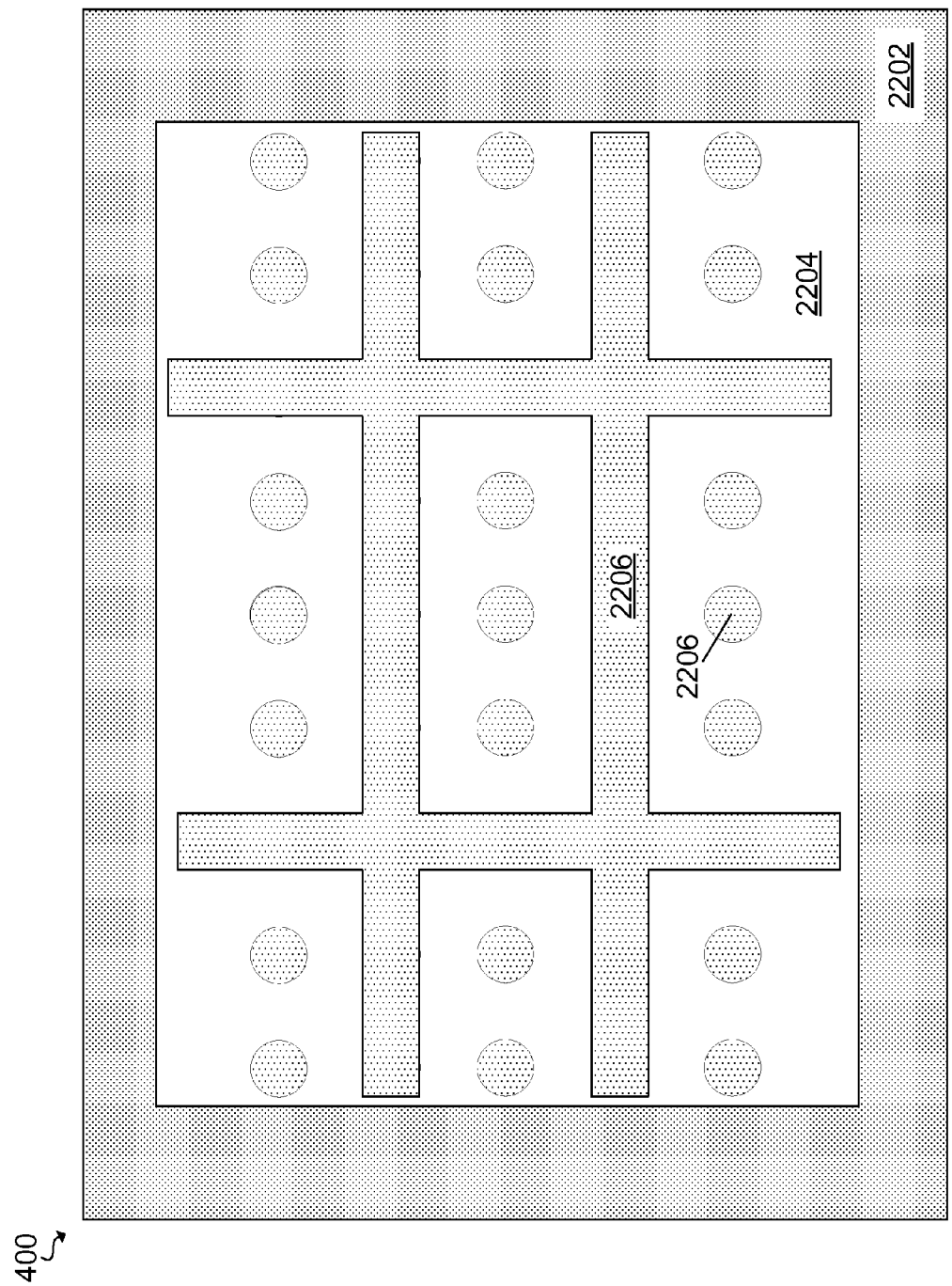
Figure 22D:
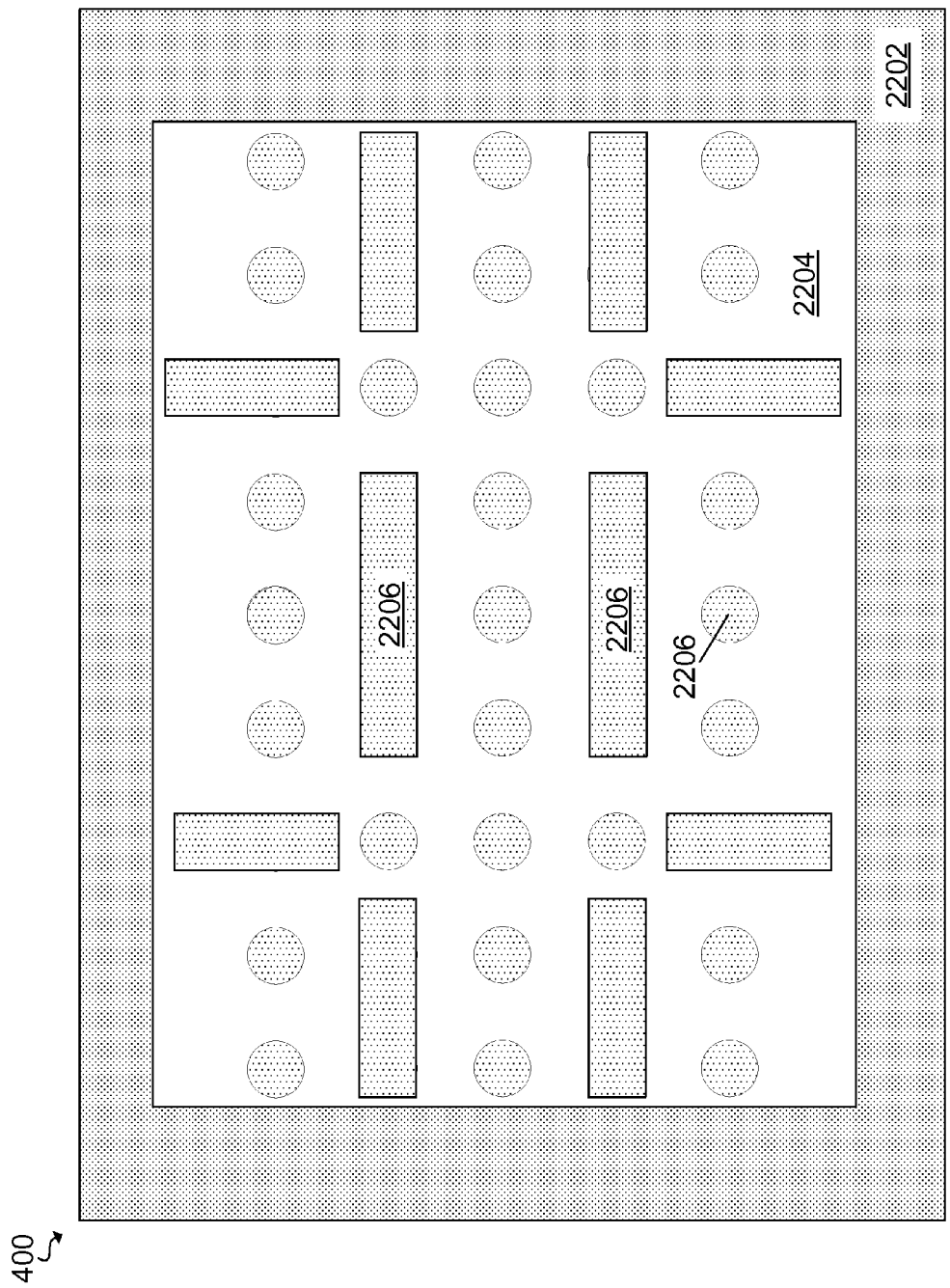

Referring now to FIGS. 22A-22D, top views of various arrangements of thermally conductive vias 2206 on a glass interposer 2204, according to various embodiments, are shown. The glass interposer 2204 may be electrically connected to a substrate 2202, and may be part of a multi-dimensional package 400. As shown in FIG. 22A, the thermally conductive vias 2206 may be located centrally on the interposer 2204. As shown in FIG. 22B, the thermally conductive vias 2206 may be spread throughout the entire interposer 2204. As shown in FIG. 22C, the thermally conductive vias 2206 may include continuous bars. As shown in FIG. 22D, the thermally conductive vias 2206 may include intermediately spaced bars.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiment, the practical application or technical improvement over technologies found in the marketplace, or to enable others of ordinary skill in the art to understand the embodiments disclosed herein.

What is claimed is:

1. A method comprising:
   forming vias in a glass interposer;
   filling the vias with a thermally conductive material, wherein the thermally conductive material is electrically insulating;
   removing the thermally conductive material from a portion of the vias; and
   depositing an electrically conductive material in the portion of the vias, on the thermally conductive material, and on the glass interposer.

2. The method of claim 1, wherein the forming vias in the glass interposer comprises:
   etching an entire thickness of the glass interposer.

3. The method of claim 1, wherein the forming vias in the glass interposer comprises:
   etching the glass interposer to form an opening that extends only through an upper portion of the glass interposer, such that the vias have a bottom that is separated from a bottom surface of the glass interposer by a lower portion of the glass interposer.

4. The method of claim 3, further comprising:
   removing the lower portion of the glass interposer to expose the bottom of the vias;
   forming a bottom seed layer on an exposed portion of the glass interposer and the exposed bottom vias;
   forming a bottom conductive material on the bottom seed layer;
   forming an opening in the bottom conductive material and the bottom seed layer;
   forming an insulator in the opening and on the bottom conductive material; and
   forming a solder connection on the bottom conductive material.

5. The method of claim 1, wherein the depositing the electrically conductive material in the portion of the vias, on the thermally conductive material, and on the glass interposer comprises:
   forming a seed layer on exposed surfaces of the glass interposer and the thermally conductive material; and
   forming a layer of conductive metal on the seed layer.

6. The method of claim 5, wherein the layer of conductive metal comprises copper, aluminum, titanium, platinum, or alloys thereof.

7. The method of claim 1, wherein the filling the vias with the thermally conductive material comprises:
   depositing the thermally conductive material in the vias and on the glass interposer, wherein the thermally conductive material comprises polysilicon, aluminum nitride, or diamond-like carbon; and
   performing a planarization process, such that the thermally conductive material is contained within the vias.

8. The method of claim 1, wherein the removing the thermally conductive material from the portion of the vias comprises:
   depositing an etch stop layer on the interposer and the thermally conductive material;
   removing portions of the etch stop layer to expose the portion of the vias; and
   removing the thermally conductive material from the portion of the vias, selective to the interposer.

9. The method of claim 1, further comprising:
   removing portions of the electrically conductive material to expose the glass interposer;
   forming an insulator on the exposed glass interposer.

10. The method of claim 1, further comprising:
    forming a solder connection on the electrically conductive material.

* * * * *